United States Patent
Neuhold et al.

(10) Patent No.: US 6,525,974 B2
(45) Date of Patent: Feb. 25, 2003

(54) INTEGRATED MEMORY WITH REDUNDANCY

(75) Inventors: Ernst Neuhold, Graz (AT); Heinz Hönigschmid, East Fishkill, NY (US); Georg Braun, München (DE); Zoltan Manyoki, CDN-Kanata (CA); Thomas Böhm, Zorneding (DE); Thomas Röhr, Yokohama (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/888,023

(22) Filed: Jun. 22, 2001

(65) Prior Publication Data

US 2002/0015337 A1 Feb. 7, 2002

Related U.S. Application Data

(63) Continuation of application No. PCT/DE99/03905, filed on Dec. 7, 1999.

(30) Foreign Application Priority Data

Dec. 22, 1998 (DE) .......................................... 198 59 517

(51) Int. Cl.[7] ................................................. G11C 7/00
(52) U.S. Cl. ...................... 365/200; 365/201; 365/225.7
(58) Field of Search ................................. 365/200, 201, 365/225.7

(56) References Cited

U.S. PATENT DOCUMENTS

| 5,568,432 | A |   | 10/1996 | Wada |
| 5,761,138 | A |   | 6/1998  | Lee et al. |
| 5,841,709 | A | * | 11/1998 | McClure ...................... 365/200 |
| 5,920,514 | A | * | 7/1999  | Lim et al. ................... 365/200 |
| 5,970,002 | A | * | 10/1999 | Yoo ............................ 365/200 |
| 6,067,260 | A | * | 5/2000  | Ooishi et al. ............... 365/200 |

FOREIGN PATENT DOCUMENTS

| DE | 4241327 C2 | 6/1995 |
| JP | 01066762   | 3/1989 |
| JP | 07272499   | 10/1995 |

* cited by examiner

*Primary Examiner*—Richard Elms
*Assistant Examiner*—Toan Le
(74) *Attorney, Agent, or Firm*—Laurence A. Greenberg; Werner H. Stemer; Ralph E. Locher

(57) ABSTRACT

An integrated memory contains two normal read amplifiers and two first redundant read amplifiers. It also contains bit lines which are combined into at least two individually addressable normal columns, at least one of which from each normal column is connected to one of the normal read amplifiers. It also has first redundant bit lines which are combined into one individually addressable redundant column, at least one of which is connected to one of the redundant read amplifiers. The first redundant read amplifier and its redundant columns are provided for replacing the two normal read amplifiers and one of the normal columns.

9 Claims, 2 Drawing Sheets

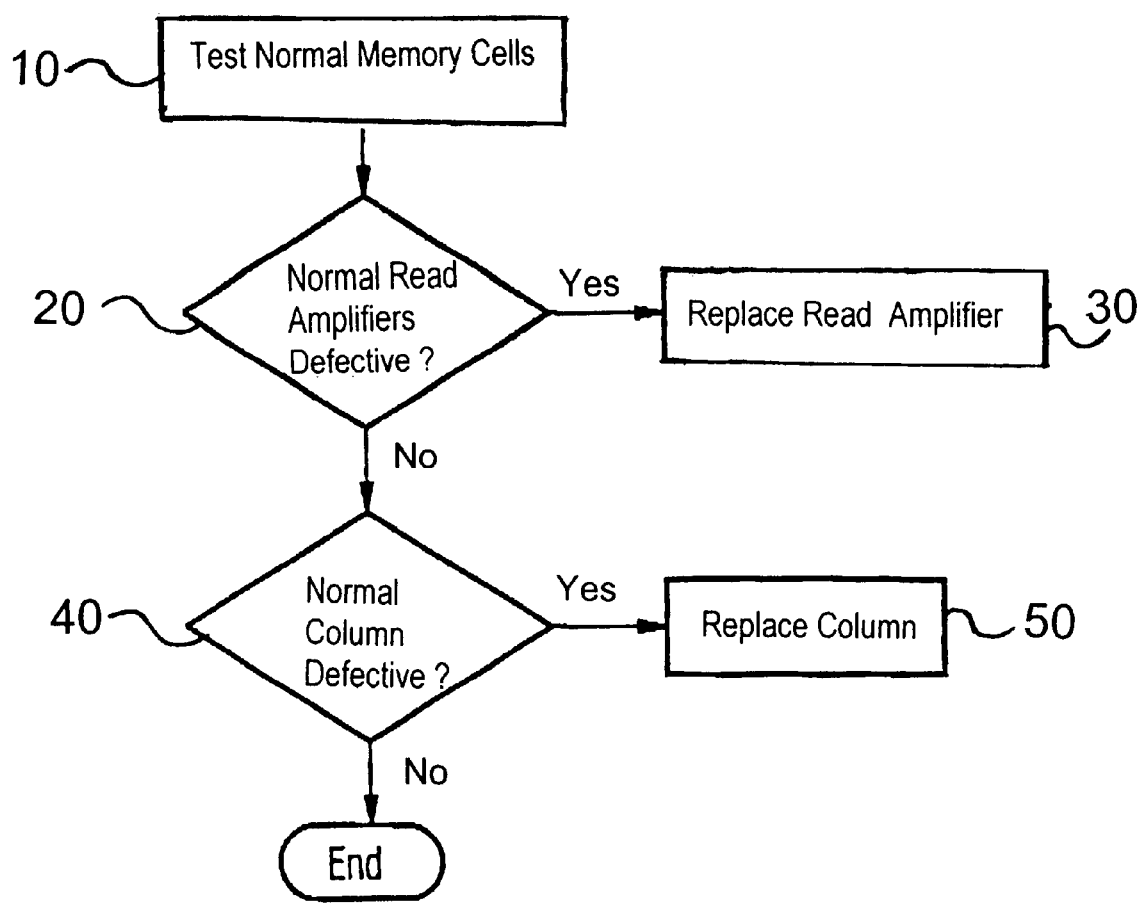

INTEGRATED MEMORY WITH REDUNDANCY

CROSS-REFERENCE TO RELATED APPLICATION

This application is a continuation of copending International Application No. PCT/DE99/03905, filed Dec. 7, 1999, which designated the United States.

BACKGROUND OF THE INVENTION

FIELD OF THE INVENTION

The invention relates to an integrated memory with redundancy.

It is generally known how to replace defective memory locations with redundant memory cells and thus repair the memory. The redundant memory locations are disposed either along redundant word lines or redundant bit lines. For example, in U.S. Pat. No. 5,568,432 an integrated memory with a redundant bit line is described, which is provided for replacing one of the normal bit lines along which normal memory locations are disposed. The normal bit line is allocated to a read amplifier, which delivers the information stored in the memory locations outside the memory in an amplified form when the memory locations are read out. The redundant bit line has a redundant read amplifier allocated to it, which serves to amplify information that is read out of the redundant memory locations in a redundancy operation, i.e. after the normal bit line has been replaced by the redundant bit line. In a redundancy operation, the defective normal bit line with its normal read amplifier is replaced by the redundant bit line with its redundant amplifier.

U.S. Pat. No. 5,761,138 teaches a semiconductor memory with a flexible redundancy block architecture. Blocks with redundant read amplifiers respectively contain four read amplifiers, which are each connected to a data line at the output side and jointly connected to a redundant global data input/data output line at an input side. Four of these respective global data input/data output lines form a bus. Redundant read amplifiers that are connected to redundant memory cell fields are connected to this, in turn. The redundancy structure serves to replace read amplifiers in memory cell fields that contain partitioned word lines and bit lines.

SUMMARY OF THE INVENTION

It is accordingly an object of the invention to provide an integrated memory with redundancy which overcomes the above-mentioned disadvantages of the prior art devices and methods of this general type, in which data can be read over a plurality of normal read amplifiers simultaneously; in which a plurality of bit lines are allocated to each read amplifier; and in which, when defects emerge, a repair can be performed easily by redundant memory cells.

With the foregoing and other objects in view there is provided, in accordance with the invention, an integrated memory. The integrated memory contains two normal read amplifiers, first switching elements having control inputs and normal bit lines combined into at least two individually addressable normal columns. At least one of the normal bit lines from each of the normal columns is connected to one of the normal read amplifiers through a respective one of the first switching elements. The control inputs of all of the first switching elements of each of the normal columns are connected to one another in order to receive a common column selection signal. Data lines are provided for transferring data to and from outside the integrated memory. At least one of the data lines is connected to one of the normal read amplifiers. The integrated memory further has two redundant read amplifiers, second switching elements having control inputs connected to one another in order to receive a common redundant column selection signal, and redundant bit lines combined into one individually addressable redundant column. At least one of the redundant bit lines is connected to one of the redundant read amplifiers through a respective one of the second switching elements. The redundant read amplifiers and the redundant column are provided for replacing the two normal read amplifiers and one of the normal columns, respectively.

The integrated memory contains two normal read amplifiers as well as normal bit lines, which are combined into at least two individually addressable normal columns. At least one of the bit lines from each normal column is connected to one of the normal read amplifiers by way of a respective first switching element. The first switching elements contain control inputs, and the control inputs of all first switching elements of every normal column are connected to one another in order to receive a common column selection signal. The memory also contains data lines for transmitting data from and to outside the memory, at least one of which is connected to one of the normal read amplifiers. It also contains two first redundant read amplifiers and first redundant bit lines combined into one individually addressable redundant column, at least one of the bit lines is connected to one of the redundant read amplifiers by way of a respective second switching element. The second switching elements contain control inputs that are connected to each other in order to receive a common redundant column selection signal. The first redundant read amplifiers and the redundant columns are provided for replacing the two normal read amplifiers and one of the normal columns.

Whereas several normal columns are allocated to the normal read amplifiers, only one redundant column having redundant bit lines is allocated to the first redundant read amplifiers. The invention is based on the recognition that, in practice, it is rare for a plurality of normal columns to contain defects. Therefore, if one were to replace all the normal columns by corresponding redundant columns given a defect in one of the normal columns, the outlay would be much greater than in the subject matter of the invention. The invention provides only one redundant column, which is sufficient for repairing defects within one normal column. In a redundancy operation, the normal read amplifiers having the defective column are replaced by the redundant read amplifiers having the redundant column; however, the normal read amplifiers continue to serve to amplify information that is read out of the remaining, non-defective normal columns.

According to a development of the invention, the integrated memory contains a second redundant read amplifier, which is connected to second redundant bit lines by way of respective third switching elements, for replacing one of the normal read amplifiers and all normal bit lines that are connected thereto by way of the first switching elements. The third switching elements have control inputs, which are provided for receiving respective additional redundant column selection signals.

The second redundant read amplifier is provided for replacing one of the normal read amplifiers including all its normal bit lines. It thus makes possible the repair of a defect that is conditioned by the read amplifier itself. Since the integrated memory according to this development contains both the first redundant read amplifiers and the second redundant read amplifiers, the utilization thereof to repair the memory depends on the type of defect. The inventive method of repairing the integrated memory thus provides that, in case of a defect of one of the normal read amplifiers, this, including the normal bit lines connected thereto, is replaced by the second redundant read amplifier and the second redundant bit lines connected thereto. In the case of a defect of one of the normal bit lines, one of the normal columns thereof is replaced by the redundant column.

According to a development of the invention, the second redundant read amplifier is connected to all the data lines by way of programmable connection elements, which are or are not electrically conductive depending on their programming status, for purposes of transferring data between one of the two redundant bit lines and one of the data lines. The connection elements make it possible to connect the second redundant read amplifier only to the data line or lines which, prior to a redundancy repair procedure, is or are connected to the normal read amplifier that has to be replaced by the second redundant read amplifier. By corresponding programming, only the connection elements which connect the second redundant read amplifier to these data lines are switched conductive. The remaining connection elements connected to the other data lines are non-conductive following the programming process. This way, the second redundant read amplifier is prevented from outputting amplified information which is read from the redundant memory locations onto the inverted data lines. In addition, this guarantees that the second redundant read amplifier receives write data only from the correct data lines.

According to another development, the normal read amplifiers are connected to the data lines by way of programmable connection elements that are electrically conductive or not depending on their programming status. These connection elements make it possible to electrically disconnect one of the normal read amplifiers which has been replaced by the second redundant read amplifier in a redundancy operation from its data line or lines by switching the connection elements connected to it into the non-conductive state.

A development of the invention provides that the normal bit lines which are connected to the same normal read amplifier be disposed interlaced with the other normal bit lines. This has the significant advantage that it is possible to determine from the geometric distribution of detected defects whether a defect of one of the normal read amplifiers or a defect within one of the normal columns (i.e. a defect of the normal bit lines or normal memory cells) is present. Defects frequently emerge which relate to several adjoining bit lines simultaneously. Because the bit lines that are allocated to the same normal read amplifier are not adjacent but rather interlaced according to the invention, it is highly unlikely that bit line defects will involve all these bit lines simultaneously. Simply put, they are not adjacently disposed. Thus, if such a defect is detected, it is most likely a defect of the read amplifier itself. Accordingly, the read amplifier can be repaired with the aid of the second redundant read amplifier. On the other hand, if a defect exists not in one of the normal read amplifiers, but rather in one of the normal columns, then most likely adjacent bit lines that are allocated to several of the normal read amplifiers are defective. Such a defect can thus be easily differentiated from a defect of one of the normal read amplifiers and eliminated using the first redundant read amplifiers and the redundant columns.

With the foregoing and other objects in view there is further provided, in accordance with the invention, a method of repairing an integrated memory. The method includes the steps of replacing a defective normal read amplifier and normal bit lines connected to the defective normal read amplifier with a redundant read amplifier and redundant bit lines connected to the redundant read amplifier if one of a plurality of normal read amplifiers is defective; and replacing a defective normal bit line in a normal column with a redundant column if one of the normal bit lines of the normal column is defective.

Other features which are considered as characteristic for the invention are set forth in the appended claims.

Although the invention is illustrated and described herein as embodied in an integrated memory with redundancy, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a flow chart describing the exemplifying embodiment of a repair method.

DESCRIPTION OF THE PREFERRED EMBODIMENTS

Figure 1:
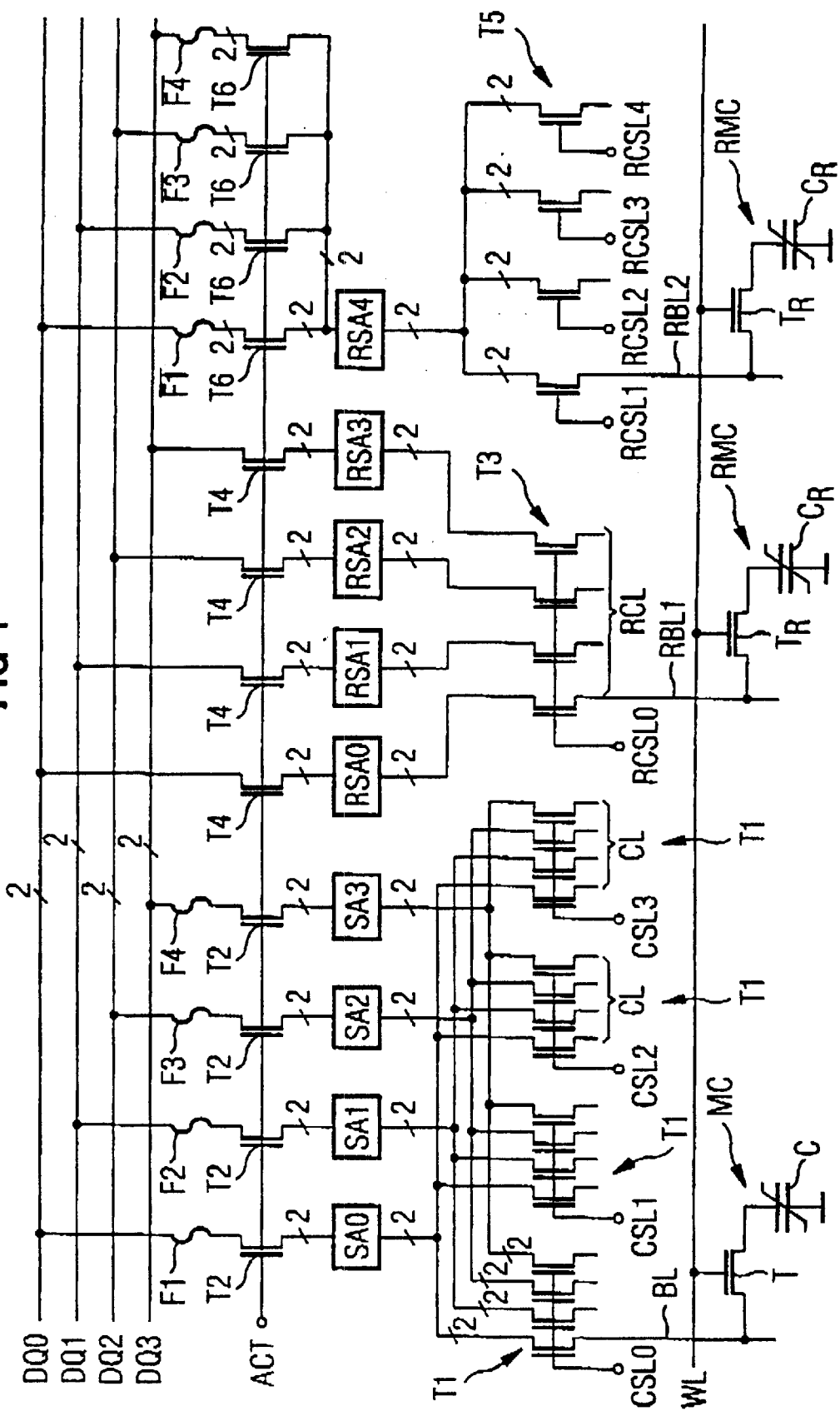
FIG. 1 is a block circuit diagram of an exemplifying embodiment of an integrated memory according to the invention.

In all the figures of the drawing, sub-features and integral parts that correspond to one another bear the same reference symbol in each case. The figures shown are not true to scale. Referring now to the figures of the drawing in detail and first, particularly, to FIG. 1 thereof, there is shown an exemplifying embodiment of an inventive integrated memory. This is a matter of a ferroelectric memory (FRAM or FeRAM). The integrated memory contains memory cells MC at crossings of normal bit lines BL and word lines WL, which cells include a selection transistor T and a storage capacitor C with a ferroelectric dielectric, respectively. The storage capacitor C is connected to one of the normal bit lines BL by way of the controlled system of the selection transistor T. A gate of the selection transistor T is connected to one of the word lines WL. FIG. 1 shows only one of the memory cells MC, though in practice a plurality of memory cells are provided per bit line BL and per word line WL. The memory contains redundant memory cells RMC, which are disposed at crossings of redundant bit lines RBL1, RBL2 and the word lines WL and are constructed like the normal memory cells MC.

The memory in FIG. 1 contains a plurality of normal read amplifiers SAi, only four of which are shown in FIG. 1. The normal read amplifiers SAi are differential read amplifiers which serve for the transmission of differential data signals. Four respective pairs of the normal bit lines BL are combined into normal columns CL. A bit line pair BL from each normal column CL is connected to each of the normal read amplifiers SAi by way of first n-channel transistors T1. Gates of the first transistors T1 of each normal column CL are connected to one another. A separate column selection signal CSLi is fed to each of them. In operation, only the bit line pairs BL of one of the four columns CL are connected to the four normal read amplifiers SAi by way of the column selection signals CSLi. The normal read amplifiers SAi are each connected to a respective data line pair DQi by way of second n-channel transistors T2 and first programmable connection elements Fi. In a memory access process, all second transistors T2 are switched conductive by way of their gates by an activation signal ACT, so that data can be transferred by way of the normal read amplifiers SAi from the data line pairs DQ1 to the bit line pairs BL of one of the normal columns CL whose column selection signal CSLi has a high level. Likewise, data can be transferred from the bit line pairs of the normal columns CL to the four data line pairs DQi by way of the normal read amplifiers SAi.

The memory contains additional groups (which are not represented in FIG. 1) of four respective normal read amplifiers SAi with appertaining normal columns CL, which are connected to the four data line pairs DQi. However, during operation only one of the normal columns CL is active, so that data can be read into or out of its memory cells MC.

The memory in FIG. 1 further contains four first redundant read amplifiers RSA0 . . . 3, which are respectively connected to first redundant bit line pairs RBL1 by way of respective third n-channel transistors T3. The first redundant bit line pairs RBL1 form a redundant column RCL. The first redundant read amplifiers RSA0 . . . 3 are each connected to one of the data line pairs DQi by way of fourth n-channel transistors T4, whose gates are likewise connected to the activation signal ACT. The gates of the third transistors T3 are connected to a redundant column selection signal RCSL0.

The integrated memory in FIG. 1 additionally contains a second redundant read amplifier RSA4, which is connected to four second redundant bit line pairs RBL2 by way of fifth n-channel transistors T5, and to all data line pairs DQi by way of sixth n-channel transistors T6 and second programmable connection elements/Fi. The gates of the two fifth transistors T5 of each second redundant bit line pair RBL2 are each connected to an additional redundant column selection signal RCSL1 . . . 4. The gates of the sixth transistors T6 are likewise connected to the activation signal ACT.

In the memory presently under consideration, the normal and redundant read amplifiers SAi, RSAi are differential read amplifiers, which are connected on one side to bit line pairs BL, RBLi, and on the other side to data line pairs DQi. But the invention can also be applied to memories containing read amplifiers that do not function differentially and that are connected on one hand to only one bit line instead of to a pair and on the other hand to one data line instead of a pair for the purpose of transferring data in a write access or read access operation.

The redundant column RCL in FIG. 1 serves for replacing one of the normal columns CL in a redundancy operation. If a defect is detected in one of the normal columns CL, the column select signal CSLi that is allocated thereto is suppressed when the column is addressed, and the redundant column selection signal RCSL0 is activated instead. Thus, the redundant memory cells RMC that are connected to the first redundant bit line pairs RBL1 are selected instead of the normal memory cells MC. But the normal read amplifiers SAi continue to serve for the transfer from or to the remaining normal columns CL which do not have any defects.

The second redundant read amplifier RSA4 serves for repairing one of the normal read amplifiers SAi. It replaces this together with the bit line pairs BL of the normal read amplifier which are connected to it by way of the first transistors T1. To accomplish this, it is necessary that one of the additional redundant column selection signals RCSL1 . . . 4 be activated simultaneously with each column selection signal CSLi. For example, if the normal read amplifier SA0 on the far left in FIG. 1 is defective, first the first connection elements F1 that are connected to it are switched non-conductive, i.e. disconnected, in order to disconnect the amplifier SA0 from its data line pair DQ0. The second connection elements /F2, /F3 and /F4 are also disconnected, so that only the second redundant read amplifier RSA4 is still connected to the data line pair DQ0 which is allocated to the normal read amplifier SA0 that must be replaced. A redundant column decoder, which is not represented in FIG. 1, is programmed such that it generates the additional redundant column selection signals RCSL1 . . . 4 in dependence upon the normal column selection signal CSLi. In this exemplifying embodiment, for repairing one of the four normal read amplifiers SAi, the redundant column decoder is programmed such that each of the additional column selection signals RCSL1 . . . 4 matches one of the column selection signals CSLi.

In this embodiment, the connection elements Fi, /Fi are laser fuses which are initially electrically conductive when the memory is produced. After a memory test is conducted, individual connection elements can be disconnected by a laser beam, so that they become non-conductive. The connection elements can also be realized by other devices, for instance by transistors whose control potential is stored in registers in dependence upon the redundancy programming. These are thus reversibly programmable connection elements.

FIG. 2 shows an exemplifying embodiment of the inventive repair method for the memory represented in FIG. 1. First, the normal memory cells MC are tested in step 10. This is accomplished by writing data into the memory cells MC by way of the data line pairs DQi, the normal read amplifiers SAi, and the normal bit line pairs BL, and then reading out the memory cells MC in the reverse direction. If a defect of one of the normal read amplifiers SAi is detected, step 20, it is replaced by the second redundant read amplifier RSA4 as described above, step 30. If, on the other hand, none of the normal read amplifiers is defective, but a defect has been discovered in one of the normal columns CL, step 40, the appertaining normal column CL is replaced by the redundant column RCL, step 50, whereby the first redundant read amplifiers RSA0 . . . 3 are used.

The memory represented in FIG. 1 is thus suitable for the optimal repairing of different types of errors; namely, defects within one of the normal columns as well as defects of one of the normal read amplifiers SAi. In practice, each of the redundant read amplifiers RSAi is allocated to a large number of normal read amplifiers SAi. Thus, there are substantially fewer redundant read amplifiers RSAi and redundant bit line pairs RBLi that are connected thereto than normal read amplifiers SAi and normal bit lines BL that are connected to these.

In the memory represented in FIG. 1, the bit line pairs BL of each normal column CL are adjacently disposed. Thus, the normal bit line pairs of each of the normal read amplifiers are interlaced with the remaining normal bit line pairs. In this way, after a memory test is conducted, it can be determined with the aid of the test results and the established error pattern whether there is a defect in one of the normal columns CL or a defect of one of the normal read amplifiers SAi. In practice, errors frequently occur owing to contaminations during the production of the integrated memory. Contaminants such as dust particles often cause defects in several adjacent bit lines simultaneously. In the memory represented in FIG. 1, the geometric configuration of its normal bit lines BL makes it possible to easily identify whether such an error is present in one of the normal columns CL or is an error of one of the normal read amplifiers SAi. In case of the latter, errors occur in all bit line pairs BL which are connected to the normal read amplifier SAi. But, because the invention provides that these be disposed not adjacently but interlaced with the other normal bit lines (given that the bit line pairs of a normal column CL are in fact adjacently disposed) such an error cannot be caused by a typical contamination during the production process.

We claim:

1. An integrated memory, comprising:

two normal read amplifiers;

first switching elements having control inputs;

normal bit lines combined into at least two individually addressable normal columns, at least one of said normal bit lines from each of said normal columns connected to one of said normal read amplifiers through a respective one of said first switching elements, said control inputs of all of said first switching elements of a respective one of said normal columns connected to one another in order to receive a common column selection signal;

data lines for transferring data to and from outside the integrated memory, at least one of said data lines connected to one of said normal read amplifiers;

two redundant read amplifiers;

second switching elements having control inputs connected to one another in order to receive a common redundant column selection signal; and redundant bit lines combined into one individually addressable redundant column, at least one of said redundant bit lines connected to one of said redundant read amplifiers through a respective one of said second switching elements, said redundant read amplifiers and said redundant column provided for replacing said two normal read amplifiers and one of said normal columns, respectively, if defective.

2. The integrated memory according to claim 1, including:

further redundant bit lines;

a third switching element having control inputs receiving additional redundant column selection signals, respectively; and a further redundant read amplifier connected to said further redundant bit lines through one of said third switching elements, for replacing one of said normal read amplifiers and all of said normal bit lines that are connected to it by way of said first switching elements.

3. The integrated memory according to claim 2, including a plurality of programmable connection elements connected between said further redundant read amplifier and all of said data lines for transferring the data between one of said further redundant bit lines and one of said data lines, said programmable connection elements are electrically conductive depending on their programming status.

4. The integrated memory according to claim 2, including a plurality of connection elements connected between said normal read amplifiers and said data lines and said connection elements are electrically conductive depending on their programming status.

5. The integrated memory according to claim 1, wherein said normal bit lines connected to a same one of said normal read amplifiers are interlaced with other ones of said normal bit lines.

6. The integrated memory according to claim 1, wherein said redundant read amplifiers and said redundant column are provided for replacing one of said two normal read amplifiers, if defective, with one of said redundant read amplifiers and said redundant column.

7. The integrated memory according to claim 1, wherein said redundant read amplifiers and said redundant column are provided for replacing one of said two normal columns, if defective, with said redundant column.

8. A method of repairing an integrated memory, which comprises the steps of:

replacing a defective normal read amplifier and normal bit lines connected to the defective normal read amplifier with a redundant read amplifier and redundant bit lines connected to the redundant read amplifier if one of a plurality of normal real amplifiers is defective; and replacing a defective normal bit line in a normal column with a redundant column if one of the normal bit lines of the normal column is defective.

9. A method of repairing an integrated memory, the integrated memory including:

two normal read amplifiers;

first switching elements having control inputs;

normal bit lines combined into at least two individually addressable normal columns, at least one of the normal bit lines from each of the normal columns is connected to one of the normal read amplifiers through a respective one of the first switching elements, the control inputs of all of the first switching elements of a respective one of the normal columns being connected to one another in order to receive a common column selection signal;

data lines for transferring data to and from outside the integrated memory, at least one of the data lines connected to one of the normal read amplifiers;

two redundant read amplifiers;

second switching elements having control inputs connected to one another in order to receive a common redundant column selection signal;

redundant bit lines combined into one individually addressable redundant column, at least one of the redundant bit lines connected to one of the redundant read amplifiers through a respective one of the second switching elements, the redundant read amplifiers and the redundant column provided for replacing the two normal read amplifiers and one of the normal columns, respectively, if defective;

further redundant bit lines;

a third switching element having control inputs receiving additional redundant column selection signals, respectively; and a further redundant read amplifier connected to the further redundant bit lines through one of the third switching elements, for replacing one of the normal read amplifiers and all of the normal bit lines that are connected to it by way of the first switching elements;

the method which comprises the steps of:

replacing a defective normal read amplifier and the normal bit lines connected to the defective normal read amplifier with the further redundant read amplifier and the further redundant bit lines connected to the further redundant read amplifier if one of the normal read amplifiers is defective; and replacing a defective normal bit line in a normal column with a redundant column if one of the normal bit lines of the normal column is defective.

* * * * *